United States Patent [19]
Matsuyama et al.

[11] Patent Number: 5,754,606
[45] Date of Patent: May 19, 1998

[54] CLOCK SIGNAL REGENERATING CIRCUIT

[75] Inventors: Koji Matsuyama; Yoshiharu Tozawa, both of Kawasaki, Japan

[73] Assignee: Fujitsu Limited, Kanagawa, Japan

[21] Appl. No.: 445,179

[22] Filed: May 19, 1995

[30] Foreign Application Priority Data

Jun. 13, 1994 [JP] Japan .................... 6-129996

[51] Int. Cl.$^6$ .................... H03D 3/24
[52] U.S. Cl. .................... 375/373; 375/376
[58] Field of Search .................... 375/354, 357, 375/359–361, 371, 373–376; 327/141, 144, 145–150, 152, 153–159, 161–163, 291, 293, 298, 299; 370/100.1, 108

[56] References Cited

U.S. PATENT DOCUMENTS

| | | | |
|---|---|---|---|
| 4,695,805 | 9/1987 | Massingill et al. | 328/72 |
| 5,034,967 | 7/1991 | Cox et al. | 375/373 |
| 5,173,617 | 12/1992 | Alsup et al. | 327/141 |
| 5,574,756 | 11/1996 | Jeong | 375/376 |

FOREIGN PATENT DOCUMENTS 2-2716   8/1990   Japan .

Primary Examiner—Stephen Chin
Assistant Examiner—Amanda T. Le
Attorney, Agent, or Firm—Helfgott & Karas, P.C.

[57] ABSTRACT

A clock signal regenerating circuit is provided for use in a receiver for receiving a burst signal or packet signal which is intermittently transmitted in digital radio communications, wherein a regenerated clock signal can be synchronized with a received signal having a short preamble. An edge extracting unit extracts an edge of the received signal and thereby detects synchronization timing involved in the received signal. A reference signal generating unit previously generates a plurality of quasi-reference signals having respective different phases and an identical frequency, and a selecting/outputting unit selects a quasi-reference signal having a phase closest to the synchronization timing involved in the received signal from among the quasi-reference signals, and outputs the selected signal as a clock signal for the receiver. Thus, the clock signal is not gradually synchronized with the synchronization timing involved in the received signal, but can be immediately synchronized with timing relatively close to the synchronization timing.

7 Claims, 14 Drawing Sheets

FIG.12a 4CLK
FIG.12b 1CLK
FIG.12c 2CLK
FIG.12d RECEIVED SIGNAL
FIG.12e EDGE
FIG.12f CONTROL SIGNAL
FIG.12g LATCH SIGNAL
FIG.12h SELECT SIGNAL msb
FIG.12i SELECT SIGNAL lsb
FIG.12j DATA0
FIG.12k DATA1
FIG.12l DATA2
FIG.12m DATA3
FIG.12n RECEIVED SIGNAL

CLOCK SIGNAL REGENERATING CIRCUIT

BACKGROUND OF THE INVENTION (1) Field of the Invention

The present invention relates to a circuit for regenerating a clock signal from a received signal, and more particularly, to a clock signal regenerating circuit for use in a receiver for receiving a burst signal or packet signal which is intermittently transmitted in digital radio communications.

(2) Description of the Related Art

In general, a burst signal or packet signal contains a preamble (alternating signal consisting of "0's" and "1's") at the beginning thereof for the purpose of synchronization, and on receiving the preamble, a receiver generates a clock signal for the receiving side. A circuit for generating the clock signal is called a clock signal regenerating circuit or a BTR (Bit Timing Recovery) circuit.

Personal computers and the like used in currently formulated radio LANs are equipped with a card called card modem which has a transmitting-receiving function for interfacing with a radio LAN to achieve communications. In such systems, unoccupied time slots on the radio LAN are sought for, and a personal computer carries out communication using the unoccupied time slots. In this case, the personal computer intermittently receives the time slots. Accordingly, each time the time slot is received, a clock signal must be regenerated in accordance with the preamble which is the header of the time slot.

FIG. 14 is a block diagram showing a conventional clock signal regenerating circuit. Specifically, an edge detector 101 detects an edge in the preamble of a received signal, that is, a change from "0" to "1" or vice versa of the preamble, and a phase comparator 102 compares the edge timing with the phase of a regenerated clock signal from an output terminal. The phase comparator 102 determines the advance or delay of the phase of the regenerated clock signal with respect to the edge timing, and supplies the result of the determination to an up/down counter 103. For the advance of the phase of the regenerated clock signal, the up/down counter 103 continuously counts up, and for the phase delay, the up/down counter 103 continuously counts down. Namely, continuous operation of the up/down counter 103 serves to integrate the advance or delay of the phase, and the phase difference is output as the count value of the counter. A comparator 104 compares the count value of the up/down counter 103 with a predetermined threshold from a threshold generator 105, and when the count value is greater than the predetermined threshold, the comparator 104 supplies a change signal to a frequency divider 106. The frequency divider 106 subjects a high-frequency clock signal, supplied from an oscillator 107, to frequency division at a predetermined rate and outputs a regenerated clock signal. When supplied with the change signal from the comparator 104, the frequency divider 106 changes the rate for the frequency division in incremental or decremental direction in accordance with the change signal. Consequently, the regenerated clock signal is controlled such that the phase difference detected by the phase comparator 102 decreases, and finally is synchronized with the received signal.

The phase comparator 102 and the up/down counter 103 are connected to each other by a 2-bit signal line, and also the comparator 104 and the frequency divider 106 are connected to each other by a 2-bit signal line. A bus line connects the up/down counter 103 and the comparator 104 to each other, and also connects the threshold generator 105 and the comparator 104 to each other.

With the arrangement described above, the regenerated clock signal is synchronized with the received signal which is an incoming burst or packet signal. This synchronization is achieved by degrees with time, and a time period of certain length is required before the synchronization is completed. Accordingly, the preamble transmitted has a length corresponding to the time period required for the synchronization.

In general, however, informative data cannot be sent while the preamble is transmitted. Accordingly, there is a demand for a shorter preamble to enhance the transmission efficiency, whereas the preamble should be long in order to achieve stable synchronization.

SUMMARY OF THE INVENTION

It is an object of the present invention to provide a clock signal regenerating circuit which is capable of synchronizing a regenerated clock signal with a received signal having a short preamble and which requires only short time for the synchronization of the regenerated clock signal.

To achieve the above object, there is provided a clock signal regenerating circuit for regenerating a clock signal from a received signal. The clock signal regenerating circuit comprises edge extracting means for extracting an edge of a received signal, reference signal generating means for generating a reference signal having a predetermined frequency and a plurality of quasi-reference signals out of phase with the reference signal and having an identical frequency with the reference signal, comparing means for comparing edge timing extracted by the edge extracting means with a phase of the reference signal generated by the reference signal generating means, and selecting/outputting means for selecting a quasi-reference signal having a phase closest to the edge timing from among the quasi-reference signals generated by the reference signal generating means, in accordance with a result of comparison by the comparing means, and outputting the selected quasi-reference signal as a clock signal for a receiver.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments according to the present invention will be outlined first.

Figure 1A:
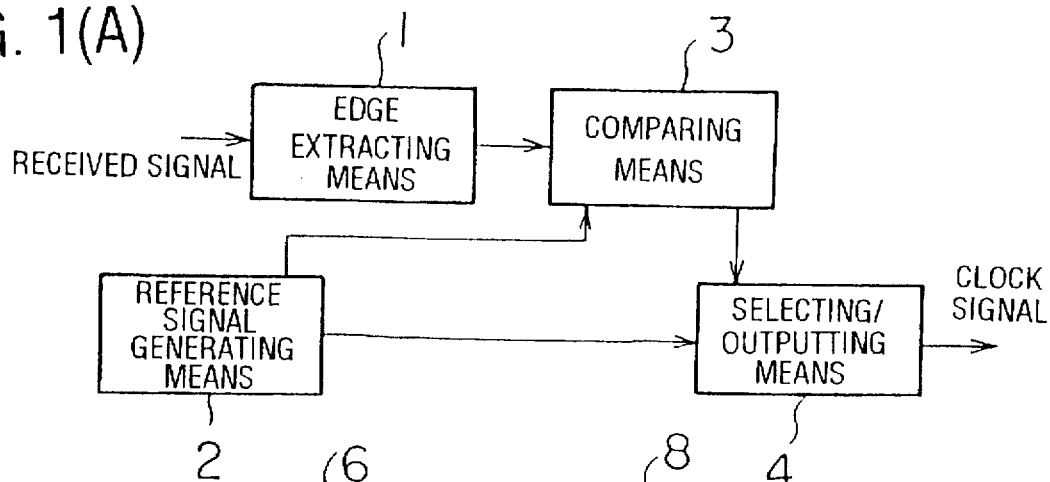
FIG. 1(A) is a diagram illustrating a first principle of the present invention.

As shown in FIG. 1(A), the present invention provides a clock signal regenerating circuit comprising edge extracting means 1 for extracting an edge of a received signal, reference signal generating means 2 for generating a reference signal having a predetermined frequency and a plurality of quasi-reference signals out of phase with the reference signal and having an identical frequency with the reference signal, comparing means 3 for comparing edge timing extracted by the edge extracting means 1 with the phase of the reference signal generated by the reference signal generating means 2, and selecting/outputting means 4 for selecting a quasi-reference signal having a phase closest to the edge timing from among the quasi-reference signals generated by the reference signal generating means 2, in accordance with the result of comparison by the comparing means 3, and outputting the selected quasi-reference signal as a clock signal for a receiver.

In this arrangement, first, the edge extracting means 1 extracts the edge of a received signal and thereby detects synchronization timing involved in the received signal. The reference signal generating means 2 previously generates a plurality of quasi-reference signals having respective different phases and having an identical frequency. The selecting/outputting means 4 selects a quasi-reference signal having a phase closest to the synchronization timing involved in the received signal, from among a plurality of quasi-reference signals, and outputs the selected quasi-reference signal as the clock signal for the receiver.

Thus, the clock signal is not gradually synchronized with the synchronization timing involved in the received signal, but can be immediately synchronized with timing relatively close to the synchronization timing.

Figure 1B:
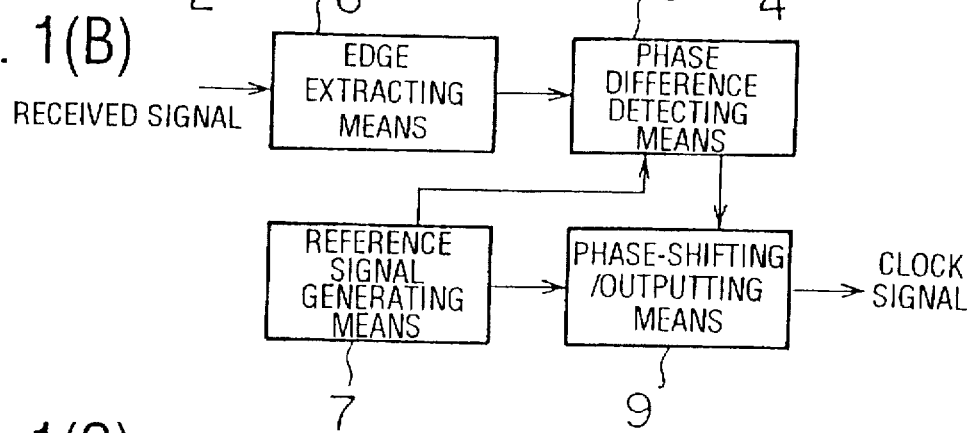
FIG. 1(B) is a diagram illustrating a second principle of the present invention.

As shown in FIG. 1(B), the present invention also provides a clock signal regenerating circuit comprising edge extracting means 6 for extracting an edge of a received signal, reference signal generating means 7 for generating a reference signal having a predetermined frequency, phase difference detecting means 8 for detecting a phase difference between edge timing extracted by the edge extracting means 6 and the phase of the reference signal generated by the reference signal generating means 7, and phase-shifting/outputting means 9 for shifting the phase of the reference signal generated by the reference signal generating means 7, in accordance with the phase difference detected by the phase difference detecting means 8, and outputting the phase-shifted reference signal as a clock signal for a receiver.

In this arrangement, the phase difference detecting means 8 detects the phase difference between the synchronization timing involved in a received signal and the phase of the reference signal. The phase-shifting/outputting means 9 shifts the phase of the reference signal in accordance with the detected phase difference so that the phase difference is eliminated, and outputs the phase-shifted reference signal as the clock signal for the receiver.

Thus, the clock signal is not gradually synchronized with the synchronization timing involved in the received signal, but can be immediately synchronized with timing relatively close to the synchronization timing.

Figure 1C:
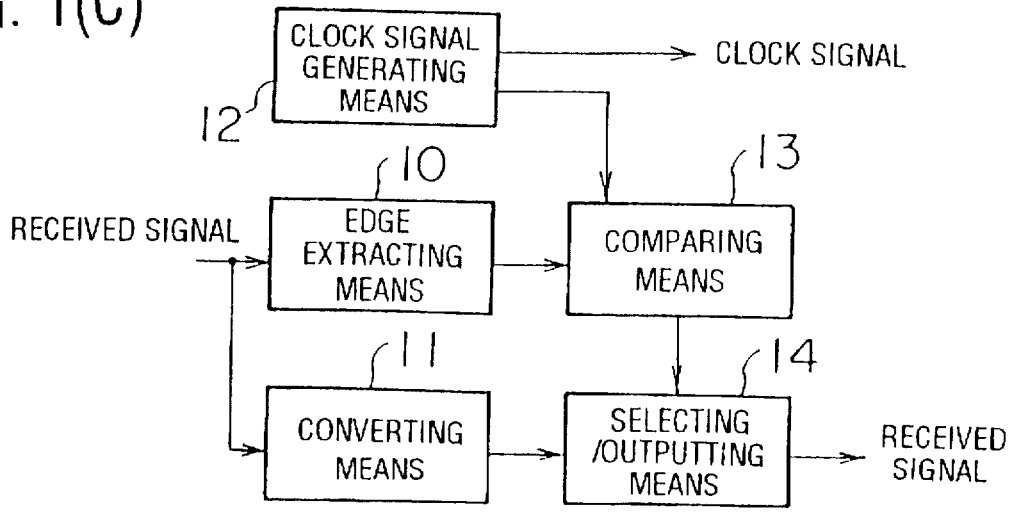
FIG. 1(C) is a diagram illustrating a third principle of the present invention.

Further, as shown in FIG. 1(C), the present invention provides still another clock signal regenerating circuit comprising edge extracting means 10 for extracting an edge of a received signal, converting means 11 for converting the received signal into a plurality of received signals each different from the received signal only in phase, clock signal generating means 12 for generating a clock signal having a predetermined frequency, comparing means 13 for comparing edge timing extracted by the edge extracting means 10 with the phase of the clock signal generated by the clock signal generating means 12, and selecting/outputting means 14 for selecting a received signal having a phase closest to the phase of the clock signal from among the received signals converted by the converting means 11, in accordance with the result of comparison by the comparing means 13, and outputting the selected received signal.

In this arrangement, the clock signal generating means 12 generates the clock signal having a predetermined frequency, and the converting means 11 converts the received signal into a plurality of received signals which are different from the received signal only in phase. The selecting/outputting means 14 selects, from among the thus-converted signals, a received signal having a phase closest to the phase of the clock signal and outputs the selected received signal.

Thus, the clock signal is not gradually synchronized with the synchronization timing involved in the received signal. Instead, the received signal is immediately caused to be almost synchronized with the clock signal on the receiving side, and then supplied to the receiving side.

In each of the above arrangements, the regenerated clock signal can be synchronized with the received signal even in the case where the preamble is short.

The embodiments of the present invention will be now described in detail.

Figure 2:
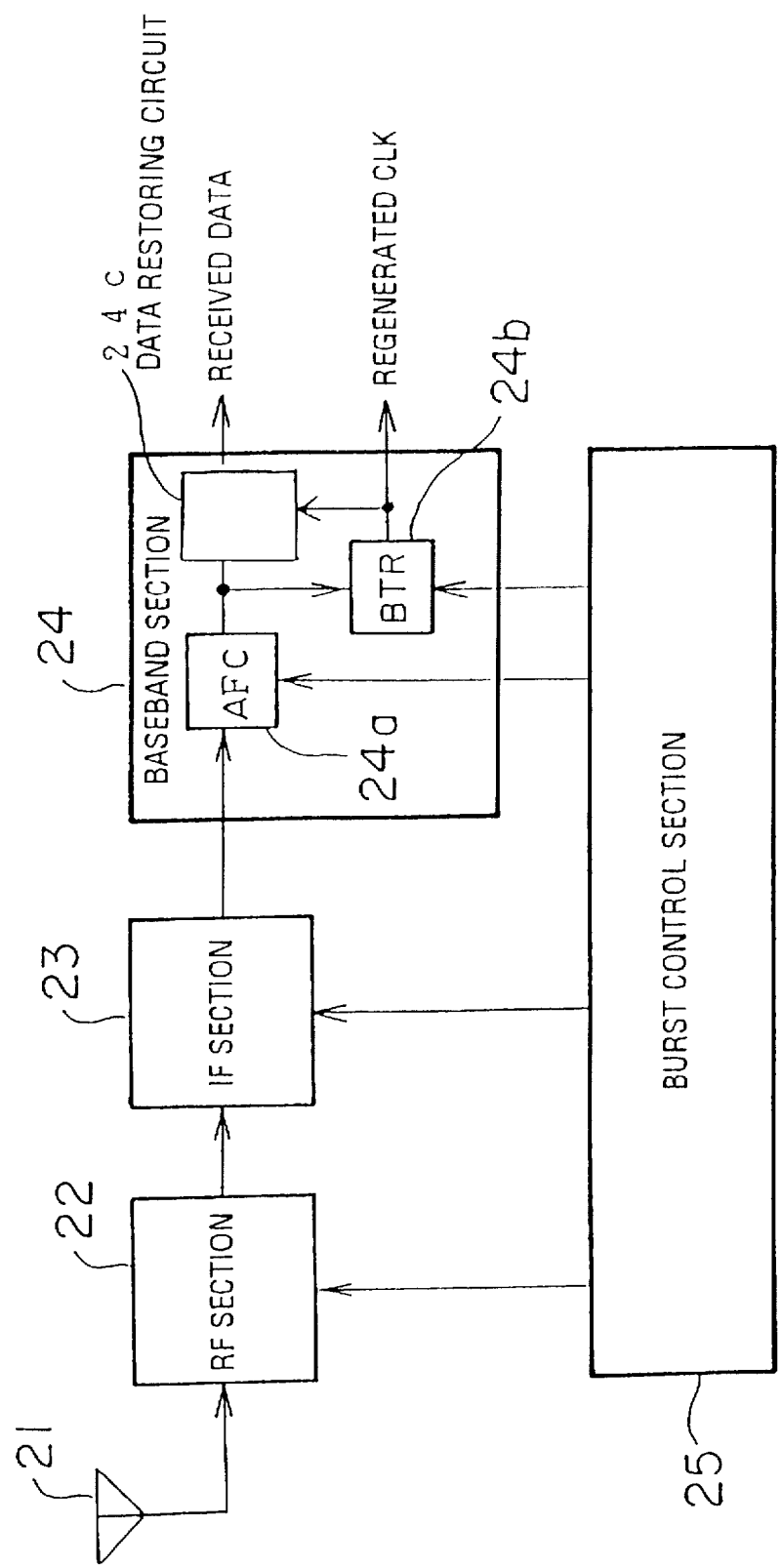
FIG. 2 is a block diagram illustrating the arrangement of a receiving circuit including a clock signal regenerating circuit according to the present invention.

FIG. 2 is a block diagram showing the arrangement of a receiving circuit containing a clock signal regenerating circuit according to the present invention. The receiving circuit is adapted for receiving a burst signal used in digital radio communications.

Referring to the figure, a signal received via an antenna 21 is supplied to a baseband section 24 through an RF section 22 and an IF section 23. The baseband section 24 carries out demodulation, and outputs received data and a regenerated clock signal to a processing circuit (not shown) of the subsequent stage. The baseband section 24 includes an automatic frequency control (AFC) circuit 24a, a clock signal regenerating circuit (BTR) 24b, and a data restoring circuit 24c. The automatic frequency control circuit 24a performs frequency pulling, and the clock signal regenerating circuit 24b performs bit timing recovery. The data restoring circuit 24c restores received data in accordance with the output of the clock signal regenerating circuit 24b. The clock signal regenerating circuit 24b forms subject matter of the present invention and will be described in detail later. The RF section 22, the IF section 23 and the baseband section 24 are connected to a burst control section 25. The burst control section 25 detects arrival of the burst signal, and based on the result of detection, performs various control operations with respect to the individual sections, for example, to lessen electric power consumption while no signal is received, and also supplies the clock signal regenerating circuit 24b of the baseband section 24 with a control signal f, described later. The control signal f assumes an ON (high-level) state for a predetermined time period at an initial stage of arrival of the burst signal.

The internal arrangement of the clock signal regenerating circuit 24b will be now explained in detail.

Figure 3:
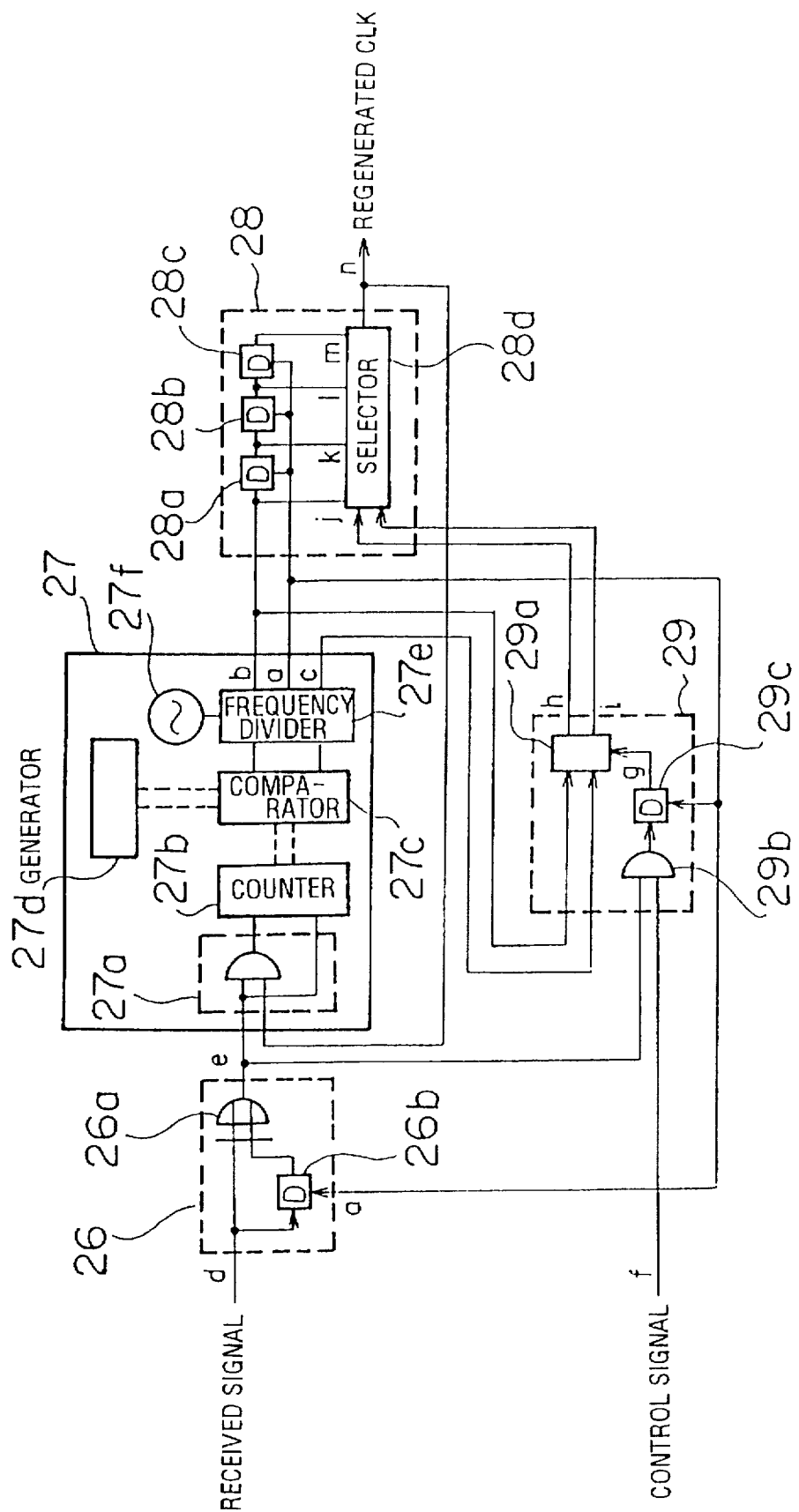
FIG. 3 is a block diagram of a clock signal regenerating circuit according to a first embodiment.

FIG. 3 is a block diagram showing a clock signal regenerating circuit according to a first embodiment. A received signal d is input to an edge detecting circuit 26. The edge detecting circuit 26 includes an exclusive-OR (EX-OR) circuit 26a and a delay circuit 26b which comprises a flip-flop. The delay circuit 26b serves to delay the received signal d by the period of a quadruple clock signal a (4CLK), mentioned later, and the exclusive-OR circuit 26a is supplied with the received signal d, as well as the received signal delayed by the period of the quadruple clock signal a. Accordingly, the exclusive-OR circuit 26a outputs a signal e (hereinafter referred to as the "edge") having a pulse width equal to the period of the quadruple clock signal a when the received signal d changes from "0" to "1" or vice versa.

Figure 14:
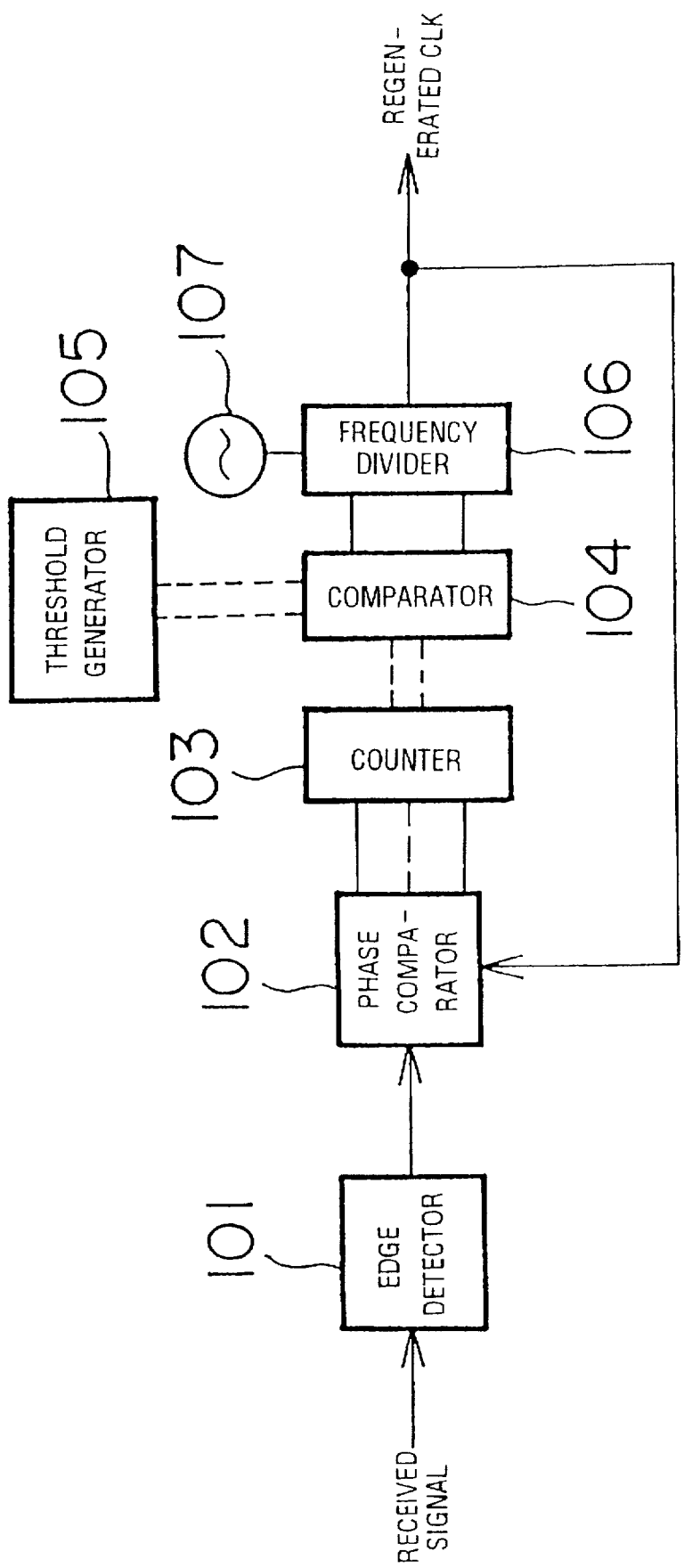
FIG. 14 is a block diagram showing a conventional clock signal regenerating circuit.

The edge e is supplied to a reference signal generating circuit 27. The reference signal generating circuit 27 comprises a phase comparator 27a, a counter 27b, a comparator 27c, a threshold generator 27d, a frequency divider 27e, and an oscillator 27f. These elements are similar in construction and operation to the corresponding ones of the phase comparator 102, up/down counter 103, comparator 104, threshold generator 105, frequency divider 106 and oscillator 107 of the conventional clock signal regenerating circuit shown in FIG. 14. However, the frequency divider 27e outputs, in addition to a reference clock signal b (1CLK), clock signals c (2CLK) and a (4CLK) synchronized with the reference clock signal and having double and quadruple frequencies, respectively.

The reference clock signal b and quadruple clock signal a output from the reference signal generating circuit 27 are supplied to a clock signal phase shifter 28. The clock signal phase shifter 28 is composed of three delay circuits 28a to 28c and a selector 28d. The delay circuits 28a to 28c serve to delay the reference clock signal b successively by the period of the quadruple clock signal a. The selector 28d selects one of a clock signal j (identical with the reference clock signal b) and clock signals k, l and m delayed respectively by the delay circuits 28a to 28c, in accordance with a 2-bit phase select signals h, i supplied thereto, and outputs the selected signal as a regenerated clock signal n. This operation is explained later with reference to FIG. 4. The regenerated clock signal n is input to the phase comparator 27a of the reference signal generating circuit 27.

A phase select signal generating circuit 29 comprises a latch circuit 29a, an AND circuit 29b, and a delay circuit 29c. The latch circuit 29a is supplied with the reference clock signal b and double clock signal c from the reference signal generating circuit 27, and these clock signals are latched by a latch signal g supplied from the delay circuit 29c. The AND circuit 29b is supplied with the edge e from the edge detecting circuit 26 and the control signal f from the burst control section 25 shown in FIG. 2, and the delay circuit 29c delays the output of the AND circuit 29b by the period of the quadruple clock signal a.

The operation of the clock signal regenerating circuit constructed as above will be described with reference to FIG. 4.

Figure 4:
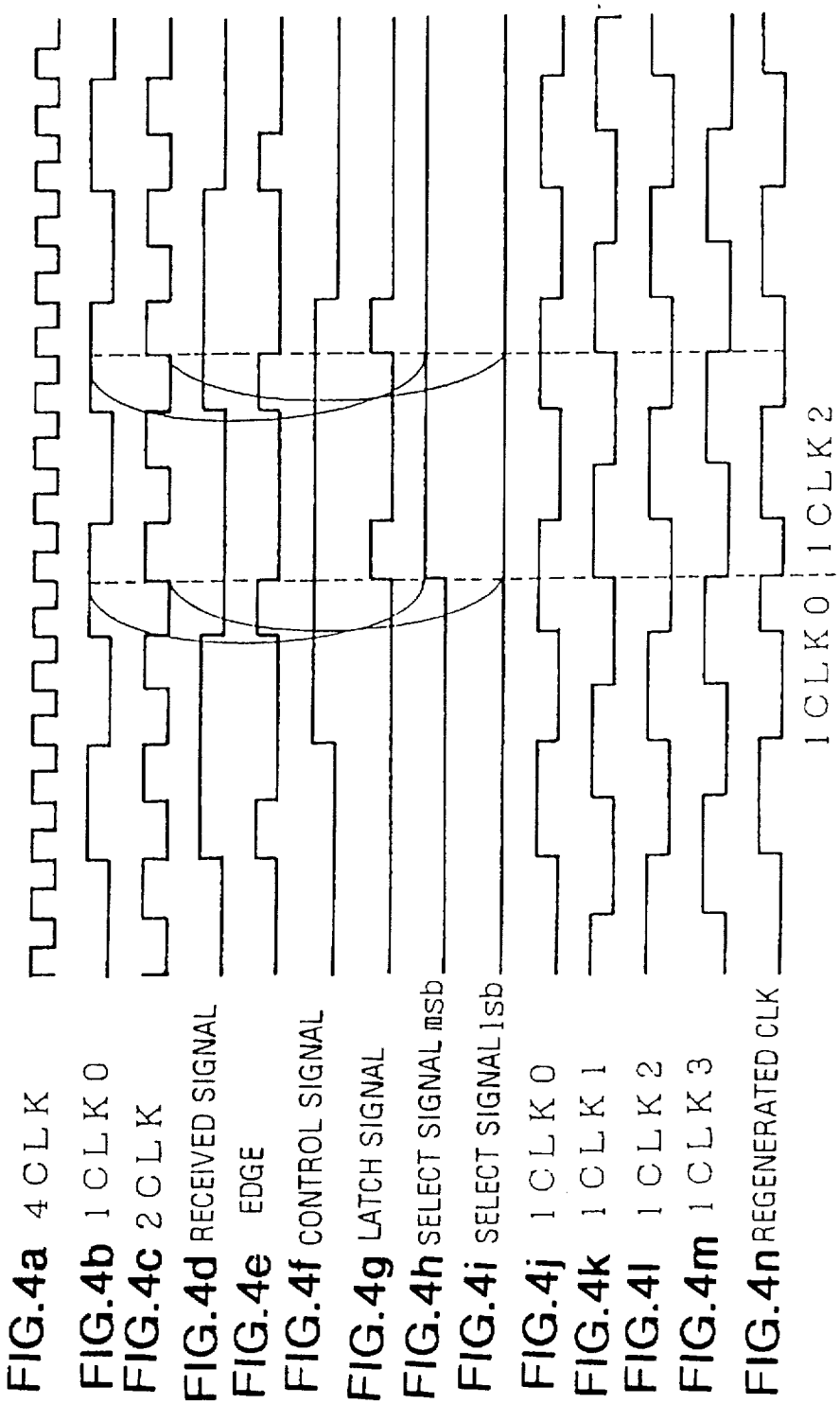
FIG. 4 is a timing chart showing signal waveforms at various parts of the first embodiment.

FIG. 4 is a timing chart showing signal waveforms at various parts in the clock signal regenerating circuit. Specifically, the reference signal generating circuit 27 generates the quadruple clock signal a (4CLK), and also the reference clock signal b (1CLK0) and double clock signal c (2CLK) timed with the quadruple clock signal. The received signal d is input to the edge detecting circuit 26, which then outputs the edge e to the reference signal generating circuit 27 and also to the AND circuit 29b of the phase select signal generating circuit 29.

The control signal f from the burst control section 25 is input to the AND circuit 29b of the phase select signal generating circuit 29. Since the control signal f is generated at an initial stage of arrival of the burst signal, the AND circuit 29b outputs an initial edge of the burst signal. The latch signal g, which is output from the delay circuit 29c, serves as a timing signal for phase comparison. Thus, in the latch circuit 29a, the reference clock signal b and double clock signal c from the reference signal generating circuit 27 are latched by the latch signal g, whereby the reference clock signal phase is compared with synchronization timing involved in the received signal (edge timing of the preamble). In accordance with the phase difference, the latch circuit 29a outputs one of four types of 2-bit phase select signals (h, i) to the selector 28d of the clock signal phase shifter 28.

The selector 28d is supplied with the four clock signals j (1CLK0), k (1CLK1), l (1CLK2) and m (1CLK3) based on the reference clock signal b (1CLK0) and having respective different phases. The selector 28d selects one of the four clock signals in accordance with the phase select signal (h, i), and outputs the selected signal as the regenerated clock signal n. Specifically, if the phase select signal (h, i) is (0, 0), the clock signal j (1CLK0) is selected, and thus the reference clock signal b (1CLK0) is output as the regenerated clock signal n without being shifted. If the phase select signal (h, i) is (0, 1), the clock signal k (1CLK1) is selected, which means that the reference clock signal b (1CLK0) is output as the regenerated clock signal n after being delayed by ¼ of the period. If the phase select signal (h, i) is (1, 0), the clock signal l (1CLK2) is selected, which means that the reference clock signal b (1CLK0) is output as the regenerated clock signal n after being delayed by ½ of the period. If the phase select signal (h, i) is (1, 1), the clock signal m (1CLK3) is selected, which means that the reference clock signal b (1CLK0) is output as the regenerated clock signal n after being delayed by ¾ of the period. The phase select signal (h, i) is output from the phase select signal generating circuit 29 so that a clock signal having a phase closest to that of the synchronization timing of the received signal d may be selected from among the four clock signals j, k, l and m. In FIG. 4, before the phase comparison, the phase select signal (h, i) is (0, 0), and thus the clock signal j (1CLK0) is output as the regenerated clock signal n. When the phase select signal (h, i) thereafter becomes (1, 0) as a result of the phase comparison, the clock signal l (1CLK2) is output as the regenerated clock signal n. Consequently, the reference clock signal b (1CLK0) is synchronized with the synchronization timing of the received signal d by being delayed by ½ of the period.

The phase difference between the regenerated clock signal n thus synchronized and the synchronization timing of the received signal d falls within a range of ±⅛ of one period of the preamble in the received signal d. This is because one symbol (corresponding to one period of the preamble) of the received signal d is matched with four samples (four periods) of the double clock signal c, as shown in FIG. 4. In the case where one symbol of the received signal d is matched with s samples of the double clock signal c, the phase difference of the regenerated clock signal n after synchronization falls within a range of ±½s of one period of the preamble in the received signal d.

The phase comparator 27a of the reference signal generating circuit 27 compares the timing of the edge e with the phase of the regenerated clock signal n, to determine whether the phase of the regenerated clock signal n is advanced or delayed with respect to the timing of the edge e, and provides the result of the determination to the counter 27b. If the phase is advanced, the counter 27b continuously counts up, and if the phase is delayed, the counter 27b continuously counts down. Namely, continuous operation of the counter 27b results in integration of the advance or delay of the phase, and the phase difference is output as the count value of the counter. The comparator 27c compares the count value of the counter 27b with a predetermined threshold from the threshold generator 27d, and when the count value is greater than the predetermined threshold, the comparator 27c supplies a change signal to the frequency divider 27e. The frequency divider 27e subjects a high-frequency clock signal, supplied from the oscillator 27f, to frequency division by means of three predetermined rates and outputs the clock signals a, b and c. When supplied with the change signal from the comparator 27c, the frequency divider 27e changes the individual rates for the frequency division in incremental or decremental direction in accordance with the change signal.

Thus, synchronization of the regenerated clock signal n with the synchronization timing of the received signal d is first roughly and instantly carried out by the clock signal phase shifter 28 at an initial stage of reception of the burst signal, and then gradually and finely adjusted by the reference signal generating circuit 27.

Figure 5:
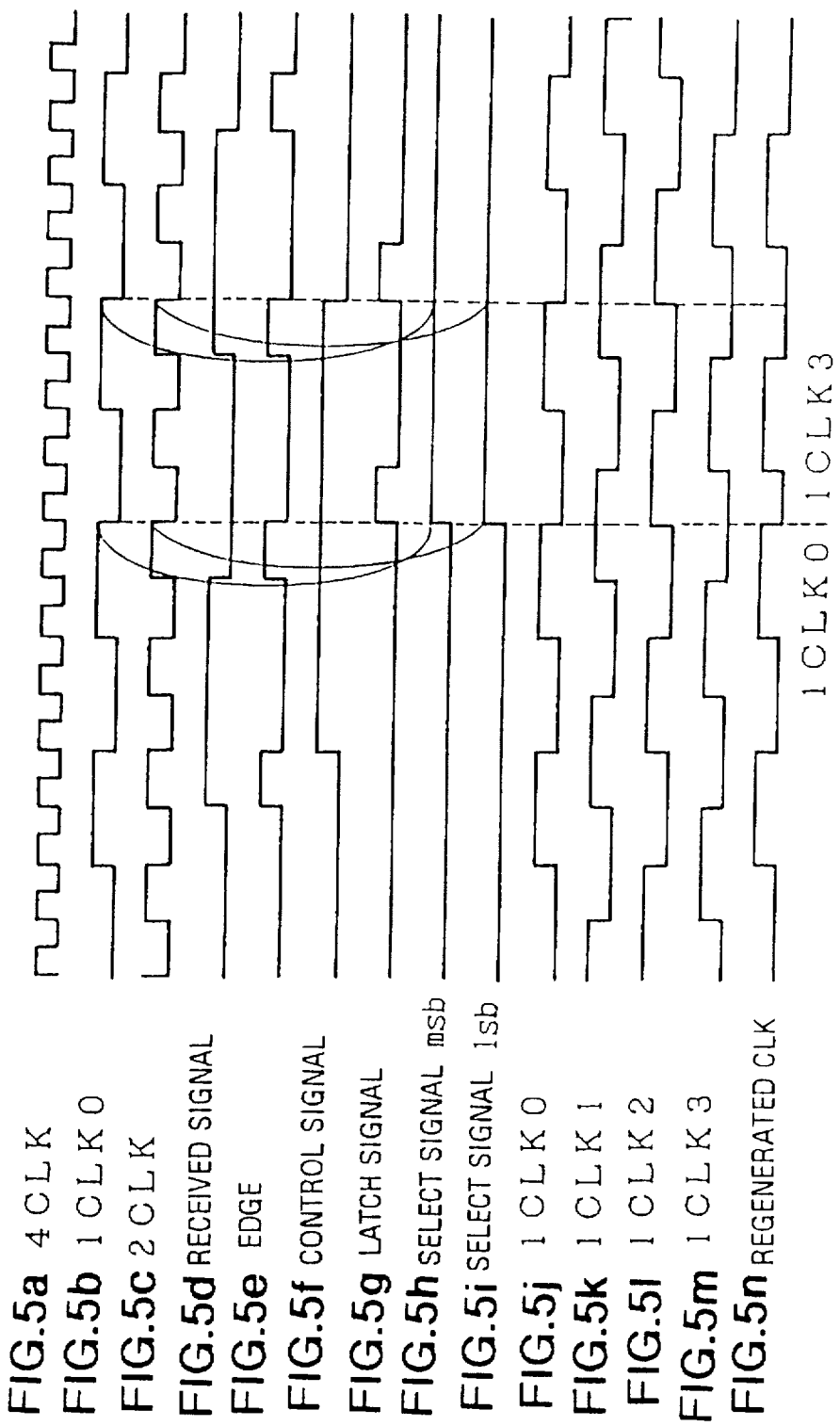
FIG. 5 is a timing chart showing signal waveforms at various parts of the first embodiment.
Figure 6:
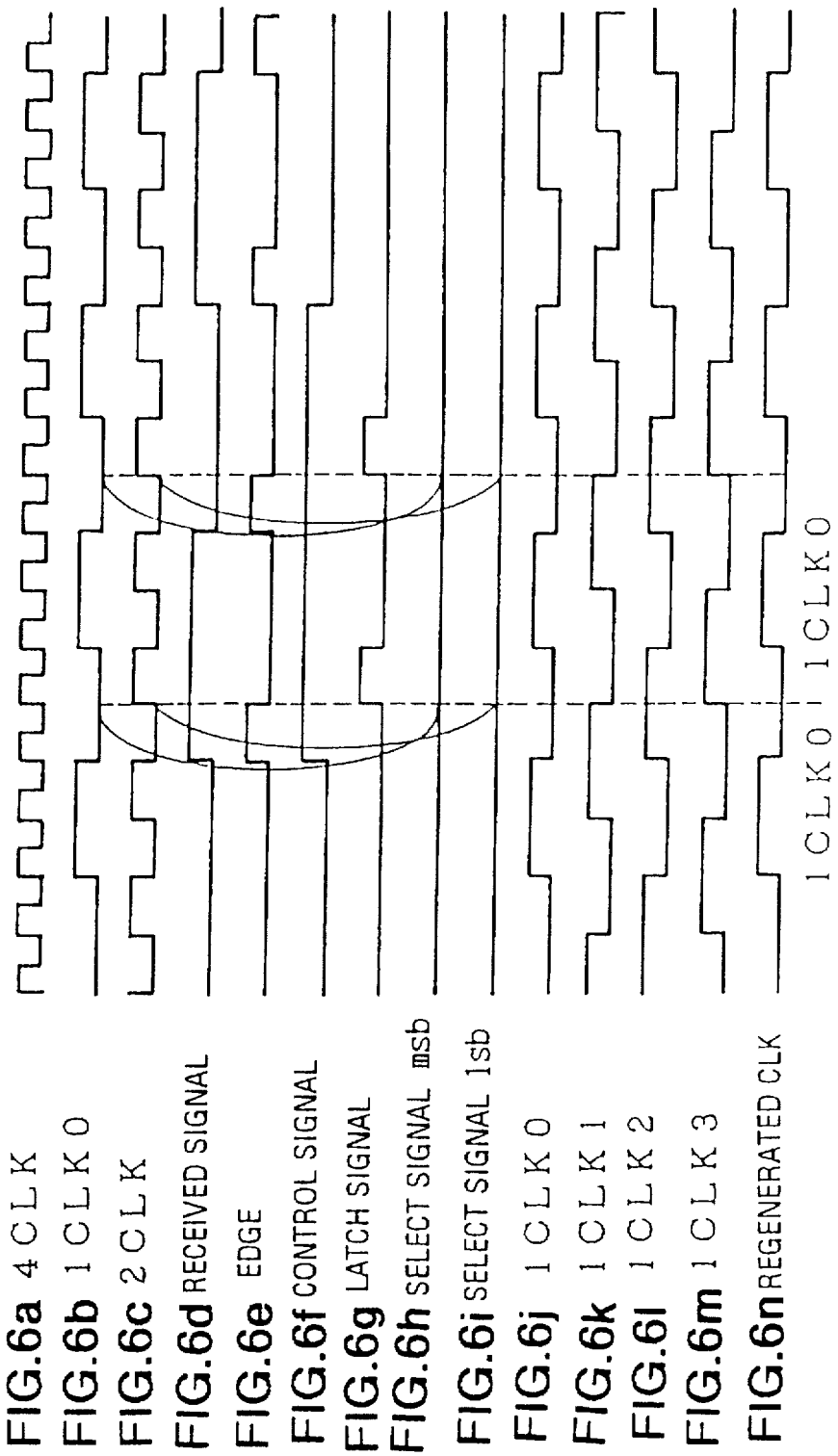
FIG. 6 is a timing chart showing signal waveforms at various parts of the first embodiment.
Figure 7:
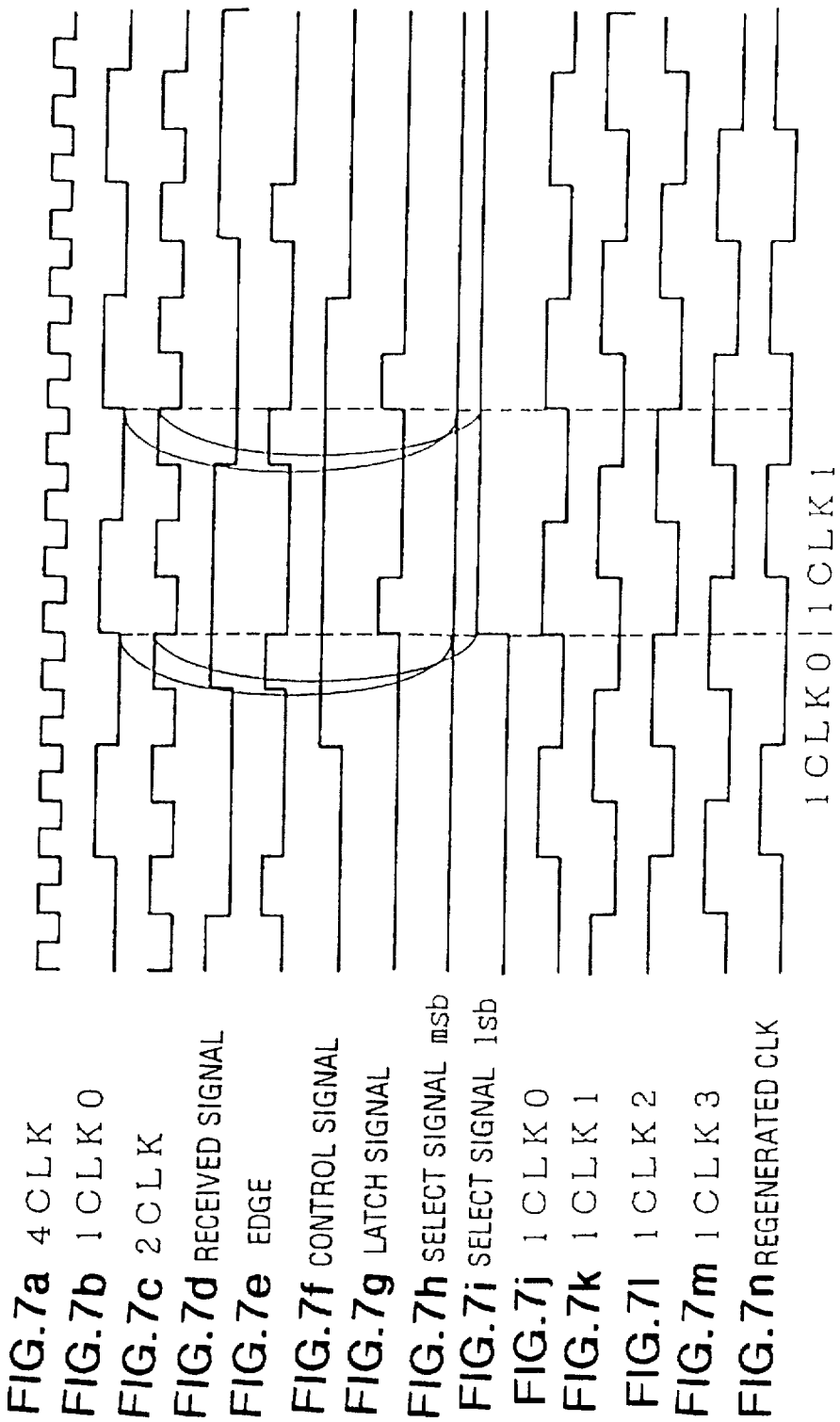
FIG. 7 is a timing chart showing signal waveforms at various parts of the first embodiment.

FIGS. 5 through 7 are timing charts each showing signal waveforms at the respective parts in the clock signal regenerating circuit observed when the synchronization timing of the received signal d differs from that shown in FIG. 4.

In FIG. 5, before the phase comparison, the phase select signal (h, i) is (0, 0), and thus the clock signal j (1CLK0) is output as the regenerated clock signal n. When the phase select signal (h, i) thereafter becomes (1, 1) as a result of the phase comparison, the clock signal m (1CLK3) is output as the regenerated clock signal n. Consequently, the reference clock signal b (1CLK0) is synchronized with the synchronization timing of the received signal d by being delayed by ¾ of the period.

In FIG. 6, before the phase comparison, the phase select signal (h, i) is (0, 0) and the clock signal j (1CLK0) is output as the regenerated clock signal n. In this case, even after the phase comparison, the phase select signal (h, i) remains (0, 0). Therefore, the clock signal j (1CLK0) is output as the regenerated clock signal n, and no phase shifting is effected because the reference clock signal b (1CLK0) is almost synchronized with the synchronization timing of the received signal d.

In FIG. 7, before the phase comparison, the phase select signal (h, i) is (0, 0) and the clock signal j (1CLK0) is output as the regenerated clock signal n. When the phase select signal (h, i) thereafter becomes (0, 1) as a result of the phase comparison, the clock signal k (1CLK1) is output as the regenerated clock signal n. Consequently, the reference clock signal b (1CLK0) is synchronized with the synchronization timing of the received signal d by being delayed by ¼ of the period.

Thus, immediately after the burst signal is received, the regenerated clock signal n is substantially synchronized with the synchronization timing of the received signal d by the clock signal phase shifter 28. Accordingly, even in cases where the preamble is short, the regenerated clock signal can be instantly synchronized with the synchronization timing of the received signal, as compared with the conventional clock signal regenerating circuit in which the clock signal is gradually synchronized with the synchronization timing of the received signal.

A clock signal regenerating circuit according to a second embodiment will be now described.

Figure 8:
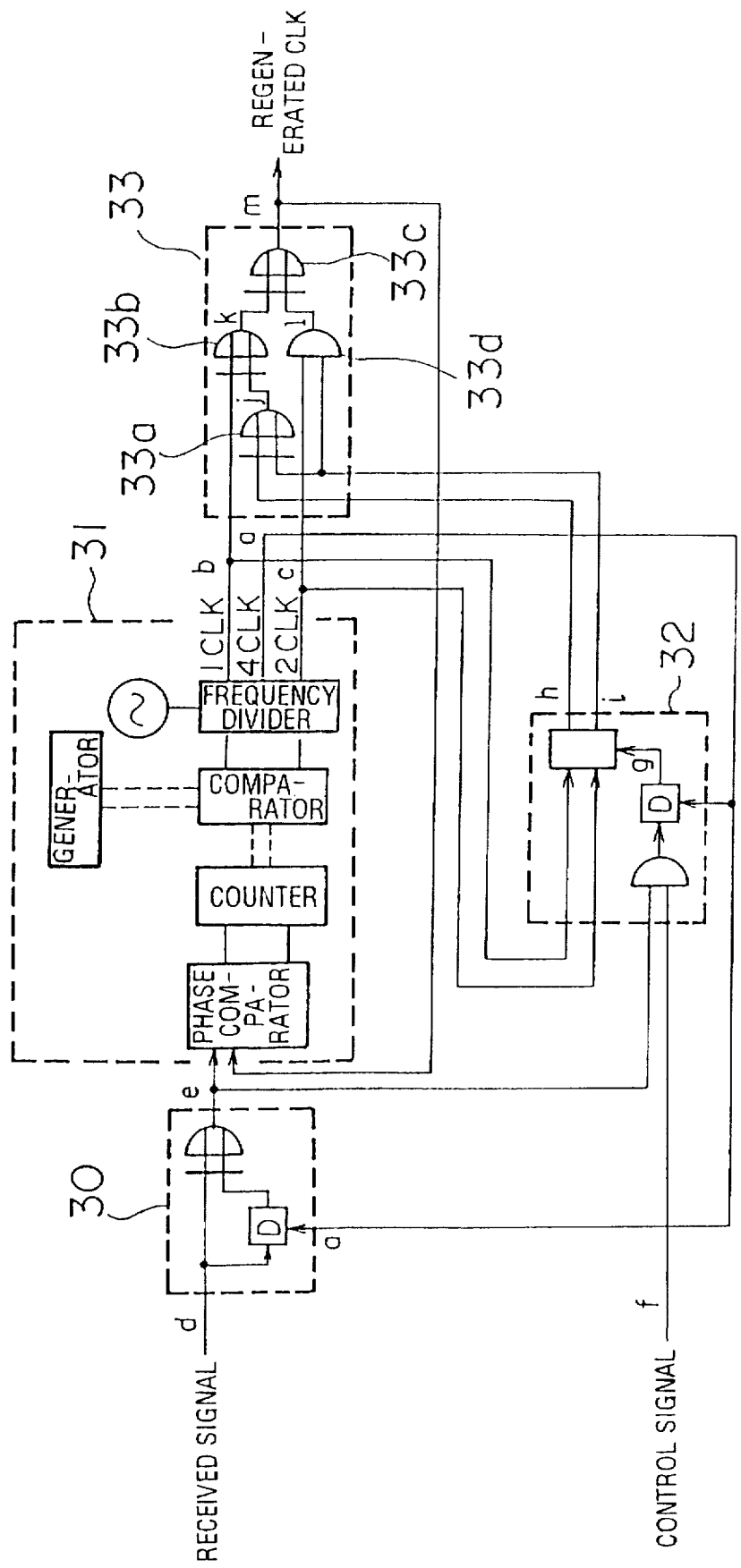
FIG. 8 is a block diagram of a clock signal regenerating circuit according to a second embodiment.

FIG. 8 is a block diagram showing the clock signal regenerating circuit of the second embodiment. The arrangement of the second embodiment is basically identical with that of the first embodiment, and the edge detecting circuit 30, reference signal generating circuit 31 and phase shift quantity signal generating circuit 32 of the second embodiment are respectively identical in arrangement with the edge detecting circuit 26, reference signal generating circuit 27 and phase select signal generating circuit 29 of the first embodiment shown in FIG. 3. The phase shift quantity signal generating circuit 32 outputs a phase shift quantity signal (h, i) which is identical with the phase select signal (h, i) output from the phase select signal generating circuit 29 of the first embodiment.

However, a clock signal phase shifter 33 is composed of exclusive-OR (EX-OR) circuits 33a, 33b and 33c, and an AND circuit 33d. The exclusive-OR circuit 33a is supplied with the phase shift quantity signal (h, i) from the phase shift quantity signal generating circuit 32, and the exclusive-OR circuit 33b is supplied with the reference clock signal b (1CLK) and an output j of the exclusive-OR circuit 33a. The AND circuit 33d is supplied with the double clock signal c (2CLK) and the phase shift quantity signal i. The exclusive-OR circuit 33c is supplied with an output k of the exclusive-OR circuit 33b and an output l of the AND circuit 33d, and outputs a regenerated clock signal m.

The operation of the clock signal regenerating circuit of the second embodiment configured as above will be described with reference to FIG. 9.

Figure 9:
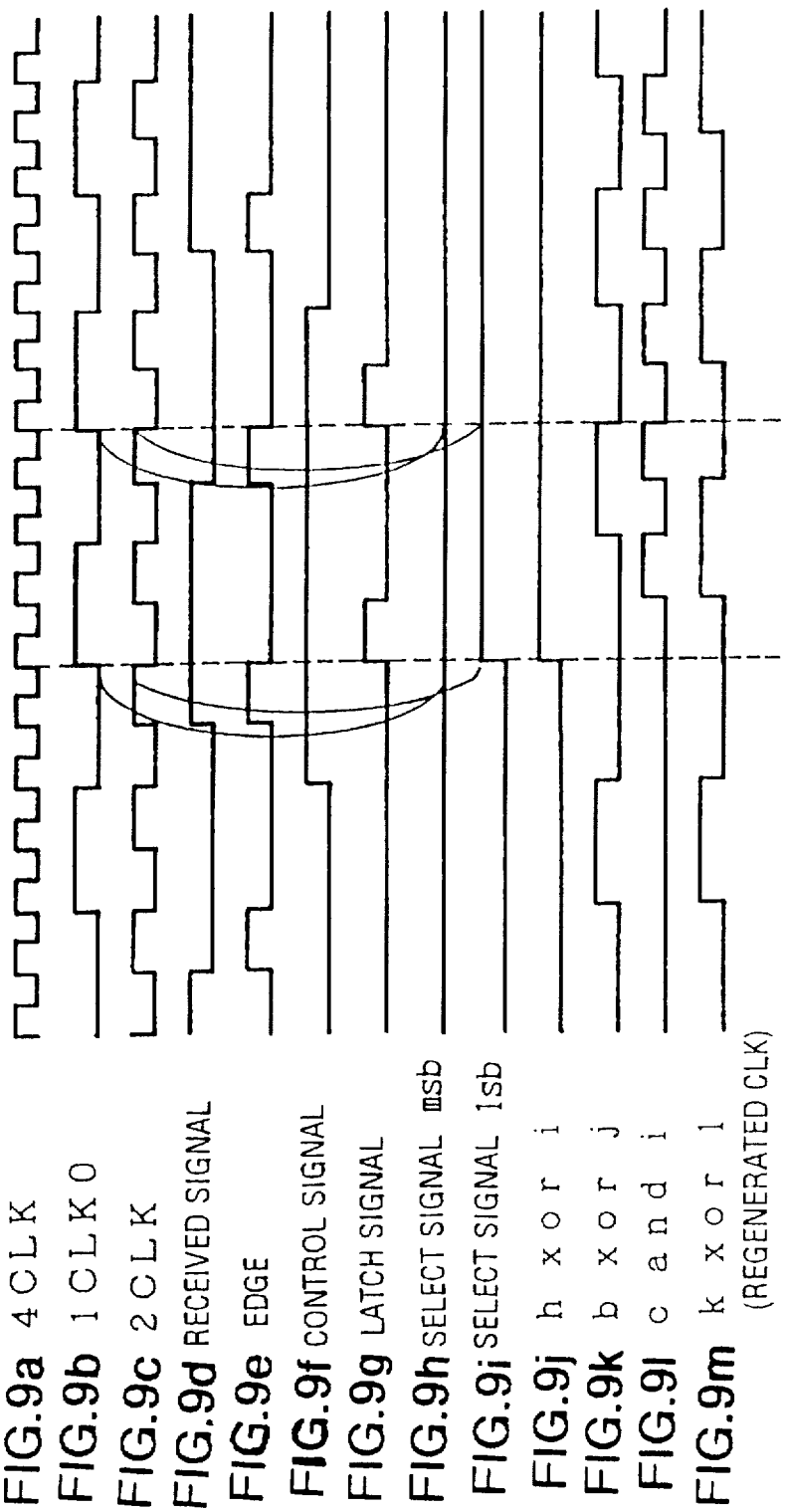
FIG. 9 is a timing chart showing signal waveforms at various parts of the second embodiment.

FIG. 9 is a timing chart showing signal waveforms at various parts in the clock signal regenerating circuit of the second embodiment. This timing chart is basically identical with FIG. 4 described with reference to the first embodiment; therefore, only differences will be explained below.

In the second embodiment, the phase shift quantity signal generating circuit 32 supplies the clock signal phase shifter 33 with one of four types of 2-bit phase shift quantity signals (h, i) depending on the phase difference between the reference clock signal phase and the synchronization timing (edge timing of the preamble) involved in the received signal.

The clock signal phase shifter 33 shifts the phase of the reference clock signal b (1CLK) in accordance with the phase shift quantity signal (h, i). Specifically, if the phase shift quantity signal (h, i) is (0, 0), the phase of the reference clock signal b is not shifted, and if the phase shift quantity signal (h, i) is (0, 1), the reference clock signal b is delayed by ¼ of the period. If the phase shift quantity signal (h, i) is (1, 0), the reference clock signal b is delayed by ½ of the period, and if the phase shift quantity signal (h, i) is (1, 1), the reference clock signal b is delayed by ¾ of the period. In FIG. 9, for example, before the phase comparison, the phase shift quantity signal (h, i) is (0, 0). In this case, the output j of the exclusive-OR circuit 33a is "0", and thus the output k of the exclusive-OR circuit 33b is identical with the reference clock signal b (1CLK). The output 1 of the AND circuit 33d is "0". Accordingly, the output (regenerated clock signal) m of the exclusive-OR circuit 33c is identical with the reference clock signal b (1CLK). When the phase shift quantity signal (h, i) thereafter becomes (0, 1) as a result of the phase comparison, the output j of the exclusive-OR circuit 33a becomes "1". Thus, the output k of the exclusive-OR circuit 33b is identical with an inverted signal of the reference clock signal b (1CLK), while the output 1 of the AND circuit 33d is identical with the double clock signal c (2CLK). Consequently, the exclusive-OR circuit 33c provides an output (regenerated clock signal) m which is obtained by delaying the reference clock signal b (1CLK) by ¼ of the period, whereby the regenerated clock signal m is synchronized with the synchronization timing of the received signal d.

The phase difference between the regenerated clock signal m thus synchronized and the synchronization timing of the received signal d falls within a range of ±⅛ of one period of the preamble in the received signal d. Namely, in the case where one symbol of the received signal d is matched with s samples of the double clock signal c, the phase difference of the regenerated clock signal m after synchronization falls within a range of ±½s of one period of the preamble in the received signal d.

Also in the second embodiment, synchronization of the regenerated clock signal m with the synchronization timing of the received signal d is first roughly and instantly carried out by the clock signal phase shifter 33 at an initial stage of reception of the burst signal, and then gradually and finely adjusted by the reference signal generating circuit 31.

Figure 10:
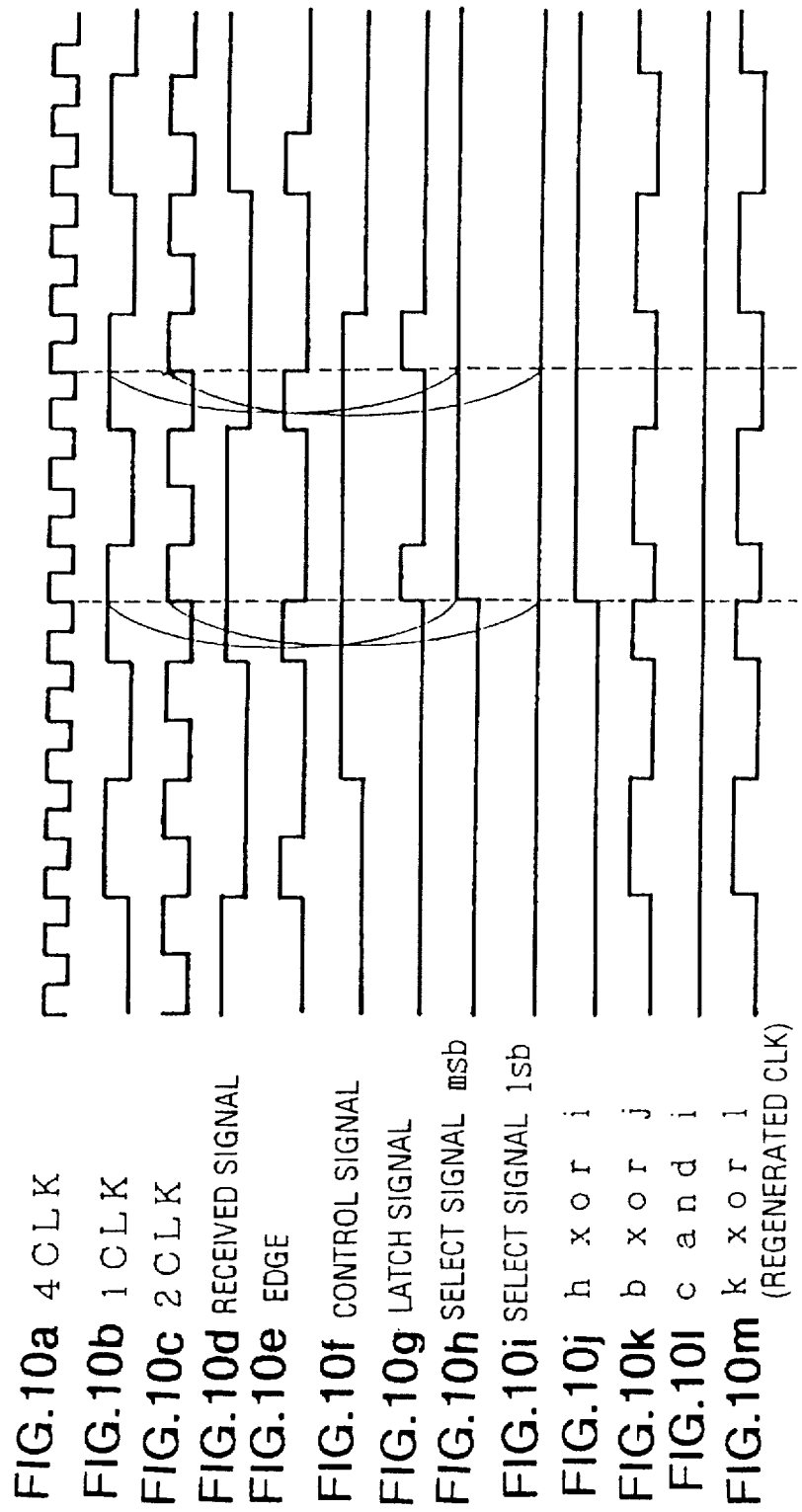
FIG. 10 is a timing chart showing signal waveforms at various parts of the second embodiment.

FIG. 10 is a timing chart showing signal waveforms at the respective parts in the clock signal regenerating circuit observed when the synchronization timing of the received signal d differs from that shown in FIG. 9.

In FIG. 10, before the phase comparison, the phase shift quantity signal (h, i) is (0, 0), and thus the output (regenerated clock signal) m of the exclusive-OR circuit 33c is identical with the reference clock signal b (1CLK). When the phase shift quantity signal (h, i) thereafter becomes (1, 0) as a result of the phase comparison, the output j of the exclusive-OR circuit 33a becomes "1". Thus, the output k of the exclusive-OR circuit 33b is identical with an inverted signal of the reference clock signal b (1CLK), while the output 1 of the AND circuit 33d is "0". Accordingly, the exclusive-OR circuit 33c provides an output (regenerated clock signal) m which is obtained by delaying the reference clock signal b (1CLK) by ½ of the period, whereby the regenerated clock signal m is synchronized with the synchronization timing of the received signal d.

A clock signal regenerating circuit according to a third embodiment will be now described.

Figure 11:
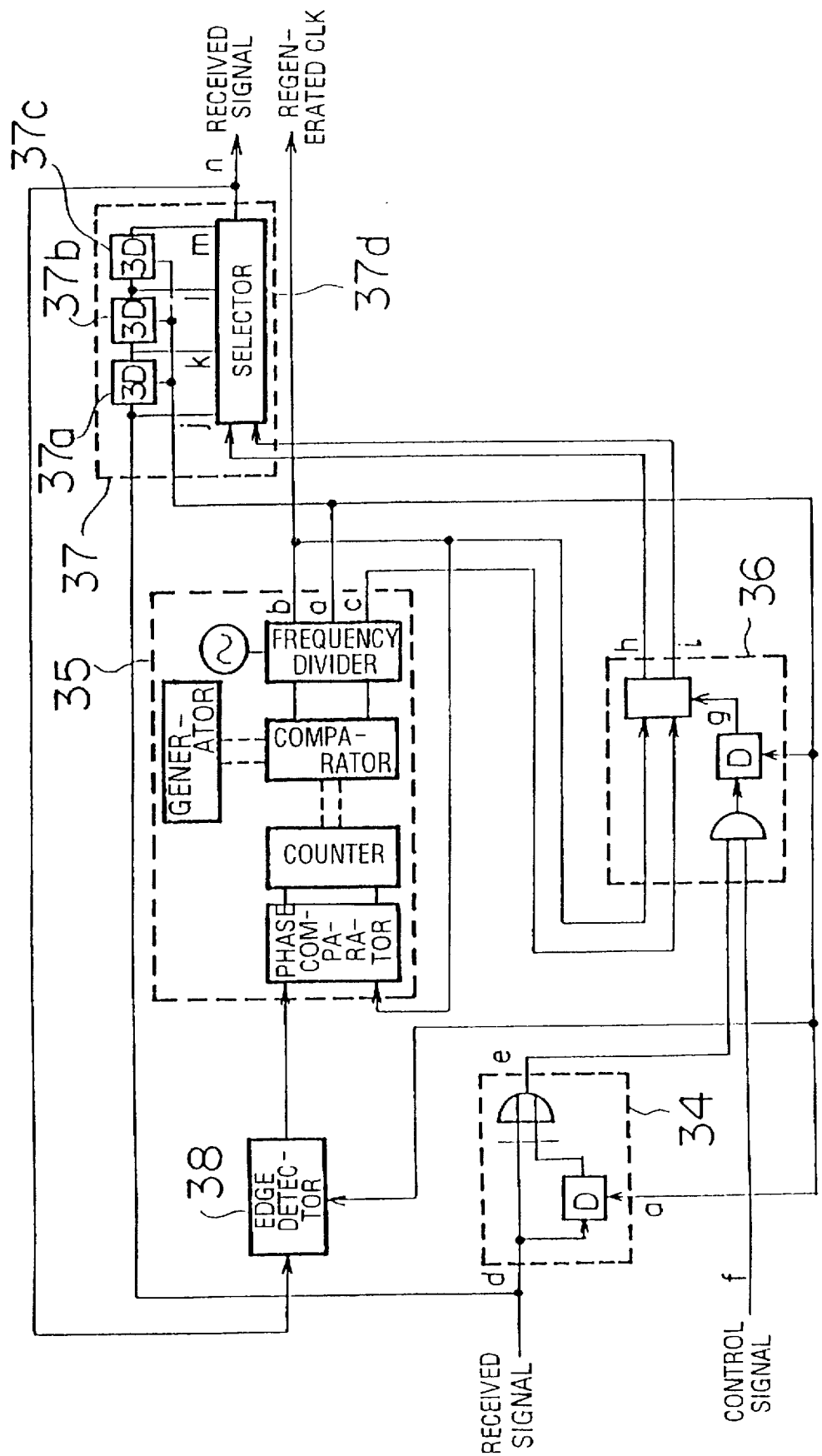
FIG. 11 is a block diagram of a clock signal regenerating circuit according to a third embodiment.

FIG. 11 is a block diagram showing the clock signal regenerating circuit of the third embodiment. The arrangement of the third embodiment resembles that of the first embodiment, and the edge detecting circuit 34, reference signal generating circuit 35 and phase select signal generating circuit 36 of the third embodiment are respectively identical in arrangement with the edge detecting circuit 26, reference signal generating circuit 27 and phase select signal generating circuit 29 of the first embodiment shown in FIG. 3.

A data phase shifter 37 is composed of three delay circuits 37a to 37c, and a selector 37d. The received signal d is input to the delay circuit 37a, and the delay circuits 37a to 37c delay the received signal d successively by one period of the quadruple clock signal a. Accordingly, the received signal d is finally delayed by three periods of the quadruple clock signal a. The selector 37d selects one of a received signal j (DATA0) identical with the received signal d and received signals k (DATA1), 1 (DATA2) and m (DATA3) delayed respectively by the delay circuits 37a to 37c, in accordance with the 2-bit phase select signal (h, i) supplied thereto, and outputs the selected signal as a received signal n synchronized with the regenerated clock signal. This operation is described later with reference to FIG. 12.

The reference signal generating circuit 35 is supplied with the reference clock signal b (1CLK), which is an output of its own, as well as an output of an edge detector 38. The edge detector 38 has an arrangement identical with that of the edge detecting circuit 34, and detects an edge of the received signal n synchronized with the regenerated clock signal.

In the third embodiment, the reference clock signal b (1CLK) output from the reference signal generating circuit 35 is directly output as the regenerated clock signal.

The operation of the clock signal regenerating circuit of the third embodiment configured as above will be explained with reference to FIG. 12.

Figure 12:
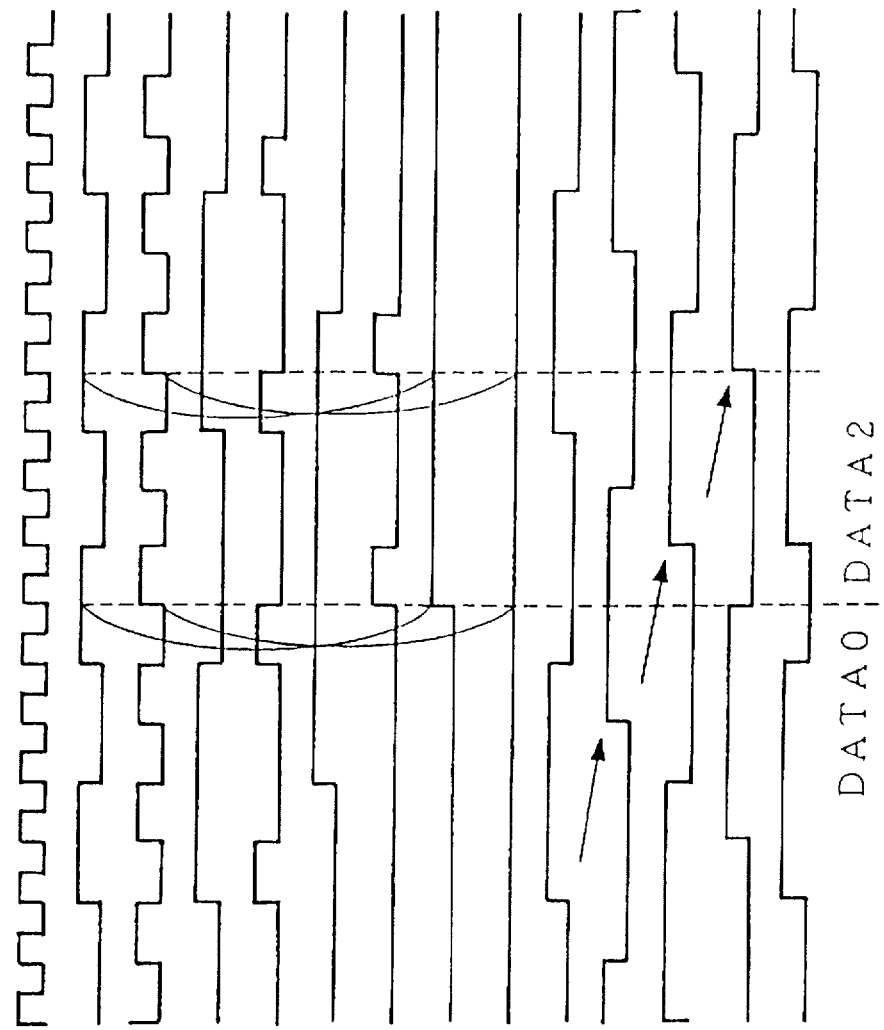
FIG. 12 is a timing chart showing signal waveforms at various parts of the third embodiment.

FIG. 12 is a timing chart showing signal waveforms at various parts in the clock signal regenerating circuit of the third embodiment. This timing chart is basically identical with FIG. 4 described with reference to the first embodiment, and therefore, only differences will be explained below.

In the third embodiment, the selector 37d is supplied with the four received signals j (DATA0), k (DATA1), 1 (DATA2) and m (DATA3) based on the received signal d and having respective different phases. The selector 37d selects one of the four signals in accordance with the phase select signal (h, i), and outputs the selected signal as the received signal n synchronized with the regenerated clock signal. Specifically, if the phase select signal (h, i) is (0, 0), the received signal j (DATA0) is selected, and thus the received signal d is output as the received signal n synchronized with the regenerated clock signal, without being shifted. If the phase select signal (h, i) is (0, 1), the received signal k (DATA1) is selected, which means that the received signal d is output as the received signal n after being delayed by ¼ of the period of the reference clock signal b. If the phase select signal (h, i) is (1, 0), the received signal 1 (DATA2) is selected, which means that the received signal d is output as the received signal n after being delayed by ½ of the period of the reference clock signal b. If the phase select signal (h, i) is (1, 1), the received signal m (DATA3) is selected, which means that the received signal d is output as the received signal n after being delayed by ¾ of the period of the reference clock signal b. The phase select signal (h, i) is output from the phase select signal generating circuit 36 so that a received signal having synchronization timing closest to the phase of the regenerated clock signal may be selected from among the four received signals j, k, 1 and m. In FIG. 12, before the phase comparison, the phase select signal (h, i) is (0, 0), and thus the received signal j (DATA0) is output as the received signal n. When the phase select signal (h, i) thereafter becomes (1, 0) as a result of the phase comparison, the received signal 1 (DATA2) is output as the received signal n. Consequently, the received signal d is synchronized with the regenerated clock signal by being delayed by ½ of the period of the reference clock signal b.

The phase difference between the received signal d thus synchronized and the regenerated clock signal falls within a range of ±⅛ of one period of the preamble in the received signal d. Namely, in the case where one symbol of the received signal d is matched with s samples of the double clock signal c, the phase difference of the received signal d after synchronization falls within a range of ±½s of one period of the preamble in the received signal d.

Also in the third embodiment, synchronization of the received signal d with the regenerated clock signal is first roughly and instantly carried out by the clock signal phase shifter 37 at an initial stage of reception of the burst signal, and then gradually and finely adjusted by the reference signal generating circuit 35.

Figure 13:
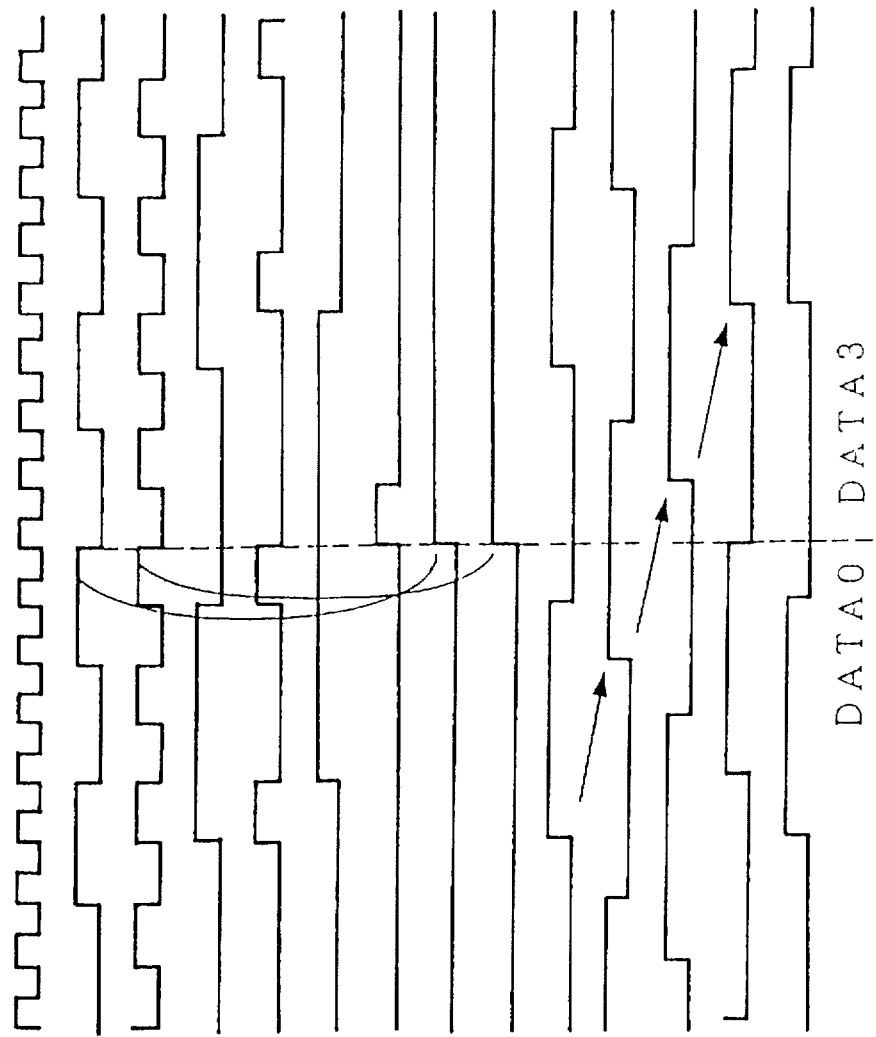
FIG. 13 is a timing chart showing signal waveforms at various parts of the third embodiment.

FIG. 13 is a timing chart showing signal waveforms at the respective parts in the clock signal regenerating circuit observed when the synchronization timing of the received signal d differs from that shown in FIG. 12. In FIG. 13, before the phase comparison, the phase select signal (h, i) is (0, 0), and thus the received signal j (DATA0) is output as the received signal n. When the phase select signal (h, i) thereafter becomes (1, 1) as a result of the phase comparison, the received signal m (DATA3) is output as the received signal n. Consequently, the received signal d is synchronized with the regenerated clock signal by being delayed by ¼ of the period of the reference clock signal b.

The foregoing description of the embodiments is based on the receiving circuit for receiving the burst signal used in digital radio communications. However, the clock signal regenerating circuit according to the present invention can be applied to a receiving circuit for receiving an intermittently transmitted signal, for example, a packet signal.

In the above embodiments, the clock signal regenerating circuit is designed to recover the bit timing. Alternatively, the clock signal regenerating circuit may use an STR (Symbol Timing Recovery) circuit to recover the symbol timing.

As described above, according to the present invention, a plurality of reference clock signals or received signals having respective different phases are previously obtained, and one of these signals almost synchronized with the synchronization timing of a received signal or with a regenerated clock signal is selected, or the phase of the reference clock signal is shifted in accordance with the synchronization timing of the received signal, whereby the received signal and the regenerated clock signal can be almost synchronized with each other immediately after a burst signal or packet signal is received. It is, therefore, possible to shorten the preamble of the received signal, whereby the transmission efficiency can be improved.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A clock signal regenerating circuit for regenerating a clock signal from a received signal, comprising:

edge extracting means for extracting an edge of a received signal;

reference signal generating means for generating a reference signal having a predetermined frequency and a plurality of quasi-reference signals out of phase with the reference signal and having an identical frequency with the reference signal;

comparing means for comparing edge timing extracted by said edge extracting means with a phase of the reference signal generated by said reference signal generating means; and selecting/outputting means for selecting a quasi-reference signal having a phase closest to the edge timing from among said plurality of quasi-reference signals generated by said reference signal generating means, in accordance with a result of comparison by said comparing means, and outputting the selected quasi-reference signal as a clock signal for a receiver, wherein said reference signal generating means compares a phase of the clock signal output from said selecting/outputting means with the edge timing extracted by said edge extracting means, and generates the reference signal having the predetermined frequency in accordance with a result of the comparison.

2. A clock signal regenerating circuit for regenerating a clock signal from a received signal, comprising:

edge extracting means for extracting an edge of a received signal;

reference signal generating means for generating a first reference signal having a predetermined frequency, a second reference signal having a double frequency, and a third reference signal having a quadruple frequency;

phase difference detecting means for detecting a phase difference between edge timing extracted by said edge extracting means and a phase of the reference signal generated by said reference signal generating means and outputting 2-bit phase difference signals; and phase-shifting/outputting means for shifting the phase of the first reference signal generated by said reference signal generating means, in accordance with the phase difference detected by said phase difference detecting means, and outputting the phase-shifted reference signal as a clock signal for a receiver, said phase-shifting/outputting means having a first exclusive-OR circuit supplied with the 2-bit phase difference detecting means, a second exclusive-OR circuit supplied with first reference signal generated by said reference signal generating means and a signal outputted from said first exclusive-OR circuit, an AND circuit supplied with the second reference signal generated by said reference signal generating means and one of the 2-bit phase difference signals outputted from said phase difference detecting means, and a third exclusive-OR circuit supplied with a signal outputted from said second exclusive-OR circuit and a signal outputted from said second exclusive-OR circuit and a signal outputted from said AND circuit and outputting the phase-shifted reference signal.

3. The clock signal regenerating circuit according to claim 2, wherein said edge extracting means detects the edge of an intermittently transmitted signal at an initial stage of reception thereof.

4. A clock signal regenerating circuit for regenerating a clock signal from a received signal, comprising:

edge extracting means for extracting an edge of a received signal;

reference signal generating means for generating a reference signal having a predetermined frequency;

phase difference detecting means for detecting a phase difference between edge timing extracted by said edge extracting means and a phase of the reference signal generated by said reference signal generating means, and;

phase-shifting/outputting means for shifting the phase of the reference signal generated by said reference signal generating means, in accordance with the phase difference detected by said phase difference detecting means, and outputting the phase-shifted reference signal as a clock signal for a receiver, wherein said reference signal generating means compares a phase of the clock signal output from said phase-shifting/outputting means with the edge timing extracted by said edge extracting means, and generates the reference signal having the predetermined frequency in accordance with a result of the comparison.

5. A clock signal regenerating circuit for regenerating a clock signal from a received signal, comprising:

edge extracting means for extracting an edge of a received signal;

converting means for converting the received signal into a plurality of received signals each different from the received signal only in phase;

clock signal generating means for generating a clock signal having a predetermined frequency;

comparing means for comparing edge timing extracted by said edge extracting means with a phase of the clock signal generated by said clock signal generating means; and selecting/outputting means for selecting a received signal having a phase closest to the phase of the clock signal from among said plurality of received signals converted by said converting means, in accordance with a result of comparison by said comparing means, and outputting the selected received signal.

6. The clock signal regenerating circuit according to claim 5, wherein said edge extracting means detects the edge of an intermittently transmitted signal at an initial stage of reception thereof.

7. A clock signal regenerating circuit for regenerating a clock signal from a received signal, comprising:

edge extracting means for extracting an edge of a received signal;

converting means for converting the received signal into a plurality of received signals each different from the received signal only in phase;

clock signal generating means for generating a clock signal having a predetermined frequency;

comparing means for comparing edge timing extracted by said edge extracting means with a phase of the clock signal generated by said clock signal generating means; and selecting/outputting means for selecting a received signal having a phase closest to the phase of the clock signal from among said plurality of received signals converted by said converting means, in accordance with a result of comparison by said comparing means, and outputting the selected received signal.

wherein said clock signal generating means compares edge timing of the received signal output from said selecting/outputting means with the phase of the clock signal output therefrom, and generates the clock signal having the predetermined frequency in accordance with a result of the comparison.

* * * * *